(12) United States Patent
Kumar (10) Patent No.: US 10,749,530 B1
(45) Date of Patent: Aug. 18, 2020

(54) PROGRAMMABLE DIVIDER WITH GLITCH-FREE LOAD CIRCUIT

(71) Applicant: NXP USA, INC., Austin, TX (US)

(72) Inventor: Prashant Kumar, New Delhi (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/392,671

(22) Filed: Apr. 24, 2019

(51) Int. Cl.
*G06F 1/08* (2006.01)
*H03K 23/40* (2006.01)
*H03K 3/017* (2006.01)

(52) U.S. Cl.
CPC .......... *H03K 23/40* (2013.01); *H03K 3/017* (2013.01)

(58) Field of Classification Search
CPC ... G06F 1/08; G06F 1/12; G06F 13/28; Y02D 10/14
See application file for complete search history.

(56) References Cited

U.S. PATENT DOCUMENTS

| | | | |
|---|---|---|---|
| 7,486,145 | B2 | 2/2009 | Floyd et al. |
| 7,579,883 | B2 | 8/2009 | Dekate et al. |
| 8,368,436 | B1 | 2/2013 | Chu |
| 8,471,608 | B2 | 6/2013 | Velayuthan |
| 8,963,588 | B2 | 2/2015 | Da Dalt |
| 9,077,348 | B1 | 7/2015 | Liu |
| 9,490,777 | B2 | 11/2016 | Ali et al. |
| 2011/0234265 | A1* | 9/2011 | Huang ...................... G06F 1/08 327/115 |

* cited by examiner

*Primary Examiner* — Sibin Chen (57) ABSTRACT

A programmable divider is provided. The programmable divider includes a clock input coupled to receive a clock signal, a control input coupled to receive a first control signal, a counter compare block, and a load block. The counter compare block is configured to receive a first load value, update a counter with the first load value, provide a first output signal, and when the first control signal is at a first value, generate a first pulse in the first output signal when the counter reaches an end value. The load block is configured to receive a first divider value and provide the first load value based on a current counter value of the counter.

20 Claims, 7 Drawing Sheets

PROGRAMMABLE DIVIDER WITH GLITCH-FREE LOAD CIRCUIT

BACKGROUND

Field

This disclosure relates generally to integrated circuits, and more specifically, to a programmable divider with glitch-free load circuit.

Related Art

Today, integrated circuits (ICs) include many sequential circuit elements such as flip-flops and latches. The frequency of operation of these sequential circuit elements is controlled by the cycling rate of clock signals. The cycling rate of the clock signals may be changed by changing divider ratios of clock divider circuits. However, many clock divider circuits are implemented with undesirable limitations.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a clock divider for generating a divided clock signal having programmable duty cycle type and divide-by values. The clock divider configuration allows for duty cycle and divide-by values to be updated on-the-fly, and switched to the updated duty cycle and/or divide-by values seamlessly and without causing glitches in the divided clock signal. The clock divider utilizes phase generation and selection circuitry configured to provide a more compact implementation and reduced power consumption.

Figure 1:
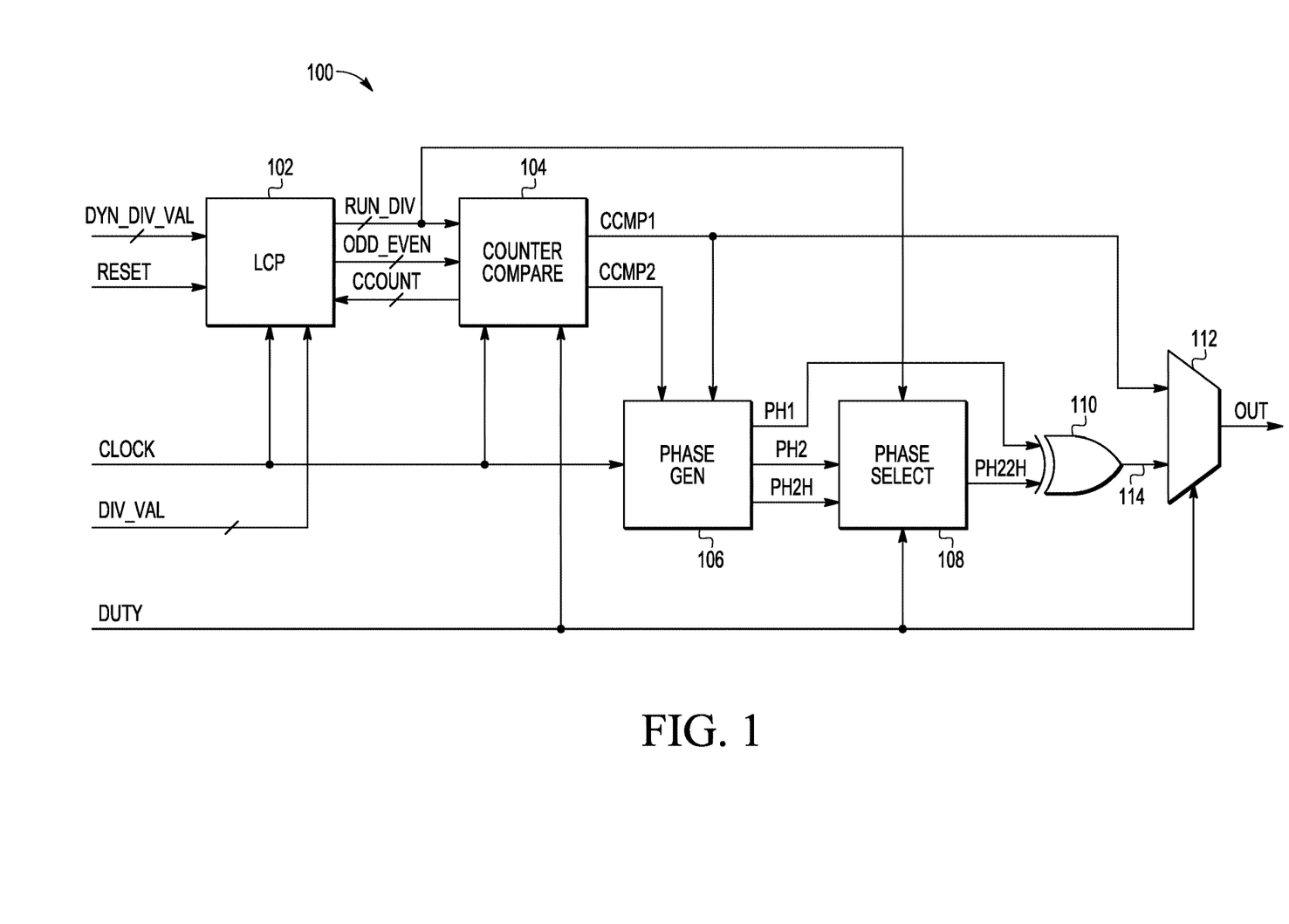
FIG. 1 illustrates, in simplified block diagram form, an example programmable divider in accordance with an embodiment.

FIG. 1 illustrates, in simplified block diagram form, an example programmable divider circuit 100 in accordance with an embodiment. Divider 100 includes a load change processing (LCP) logic circuit block 102, a counter compare logic circuit block 104, a phase generation logic circuit block 106, a phase select logic circuit block 108, exclusive OR (XOR) logic gate 110, and a multiplexer or mux 112. Divider 100 further includes inputs coupled to receive divider value (DIV_VAL), dynamic divider value (DYN_DIV_VAL), duty cycle (DUTY), reset (RESET), and clock (CLOCK) control signals and an output for providing a divided signal labeled OUT.

In this embodiment, the DIV_VAL signal is multi-bit configuration signal having a value (e.g., decimal, hex, etc.) indicative of the size (e.g., in number of bits) of the divider 100. For example, DIV_VAL may have a decimal value of 13 indicating that the divider 100 is constructed as a divide-by 13 divider (e.g., as a default configuration). In some embodiments, the DIV_VAL signal may be characterized as a parameter used in a logic synthesis phase of constructing the divider 100. The DYN_DIV_VAL signal is a multi-bit signal having a value indicative of a divide-by value for the divided output signal OUT. The divide-by value is characterized as the value by which a source clock (e.g., CLOCK) is divided. For example, with a divide-by value of 3, a resulting divided clock waveform has a frequency ⅓ of the source clock (e.g., CLOCK frequency divided by 3). The DYN_DIV_VAL signal value may be provided dynamically (e.g., during operation of the divider 100) by way of user input, software, reset, and the like. The DUTY signal is a control signal having a value indicative of a selected duty cycle type for the divided output signal OUT. In this embodiment, a punch-out duty cycle configuration is selected when the DUTY signal is at a logic low and a 50% duty cycle configuration is selected when the DUTY signal is at a logic high. In other embodiments, other duty cycle configurations may correspond to other DUTY control signal values.

The LCP block 102 of divider 100 includes inputs for receiving the DYN_DIV_VAL, DIV_VAL, CLOCK, RESET, and current counter value (CCOUNT) signals and in turn, generates a running division value (RUN_DIV) signal and an odd-or-even control (ODD_EVEN) signal at outputs. The LCP block 102 further includes control execution circuitry (e.g., finite state machine) configured to lock and latch the received DYN_DIV_VAL signal value based on the CCOUNT signal, and generate the ODD_EVEN signal and the RUN_DIV signal value for loading in the counter control circuit block 104.

The counter compare block 104 includes inputs for receiving the RUN_DIV, ODD_EVEN, CLOCK, and DUTY signals, and in turn, generates a first counter compare (CCMP1) output signal, a second counter compare (CCMP2) output signal, and a current count (CCOUNT) signal at outputs. The counter compare block 104 further includes a counter, associated control circuitry, and comparators configured to generate the CCMP1 and CCMP2 output signals.

The phase generation block 106 includes inputs for receiving the CCMP1 and CCMP2 output signals and the CLOCK signal, and in turn, generates a first phase (PH1) signal, a second phase (PH2) signal, and a third phase (PH2H) signal at outputs. The phase select block 108 includes inputs for receiving the PH2, PH2H, RUN_DIV, and DUTY, and in turn, provides a selected signal PH22H at an output. Based on the RUN_DIV and DUTY signal values, one of the PH2 and PH2H signals is selected and provided as output signal PH22H. XOR logic gate 110 includes inputs for receiving the PH1 and PH22H signal and an output 114. Multiplexer 112 includes inputs for receiving the CCMP1 signal, XOR output signal 114, and DUTY control signal and generates output signal OUT based on the value of the DUTY control signal. In this embodiment, a first value of the DUTY signal (e.g., logic low) couples the CCMP1 signal to the OUT output and a second value of the DUTY signal (e.g., logic high) couples the signal 114 to the OUT output.

Figure 2:
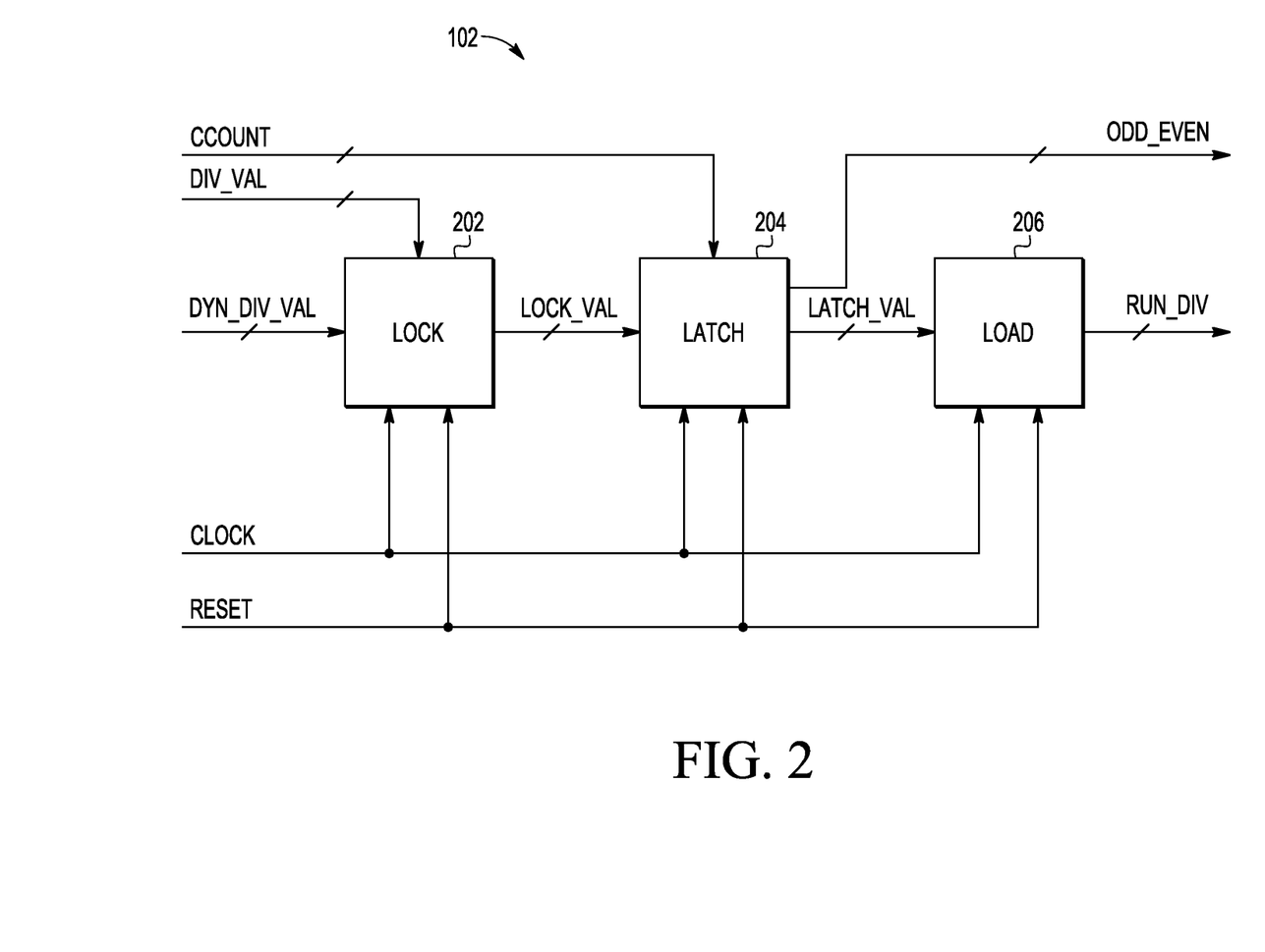
FIG. 2 illustrates, in simplified block diagram form, an example load block 102 of FIG. 1 in accordance with an embodiment.

FIG. 2 illustrates, in simplified block diagram form, an example LCP circuit block 102 of divider 100 in accordance with an embodiment. The LCP block 102 includes a lock (LOCK) portion 202, a latch (LATCH) portion 204, a load (LOAD) portion 206, and other control circuitry (not shown). The LCP block 102 receives the DYN_DIV_VAL, DIV_VAL, CLOCK, RESET, and CCOUNT signals and in turn, generates the RUN_DIV and ODD_EVEN signals at outputs.

The lock portion 202 includes circuitry configured to receive the DYN_DIV_VAL, DIV_VAL signals and CLOCK and RESET signals and in turn, provides a locked value (LOCK_VAL) of the DYN_DIV_VAL signal to the latch circuit 204. During reset, the DYN_DIV_VAL signal takes on the value of the DIV_VAL signal which propagates as the LOCK_VAL signal. Upon exiting reset, the DYN_DIV_VAL signal value is locked as the LOCK_VAL. During normal operation, the LOCK_VAL can be updated to a new DYN_DIV_VAL signal value synchronous with the CLOCK signal.

The latch portion 204 is configured to receive the CCOUNT and LOCK_VAL signals along with the CLOCK and RESET signals. The LOCK_VAL signal is latched based on a bit-wise OR of the CCOUNT signal with the LOCK_VAL signal to generate the LATCH_VAL signal. For example, when the CCOUNT value is equal to the LOCK_VAL signal value minus 1, the LOCK_VAL signal value is latched. This assures that the DYN_DIV_VAL signal value is not propagated when the CCOUNT value is zero. The resulting LATCH_VAL signal is provided to the load circuit 206. The latch portion 204 is further configured to generate the ODD_EVEN signal based on the value (e.g., least significant bit, LSB) of the LOCK_VAL signal. For example, the latch portion 204 is further configured to generate the ODD_EVEN signal by logically adding 1 to the LOCK_VAL signal value when the LSB of the LOCK_VAL signal equals 1, and when the LSB of the LOCK_VAL equals 0, then the ODD_EVEN signal is generated to have the value of the LOCK_VAL signal.

The load portion 206 is configured to receive the latched version of the locked value along with the CLOCK and RESET signals and in turn, generates the RUN_DIV signal. During reset, the RUN_DIV signal takes on the value of the DIV_VAL signal. Upon exiting reset, the RUN_DIV signal takes on the value of the DYN_DIV_VAL signal. During normal operation, the LCP block 102 provides the RUN_DIV signal to the counter compare circuit block 104 in a manner such that a new divide-by value (e.g., by way of DYN_DIV_VAL) is loaded seamlessly without causing any glitches.

Figure 3:
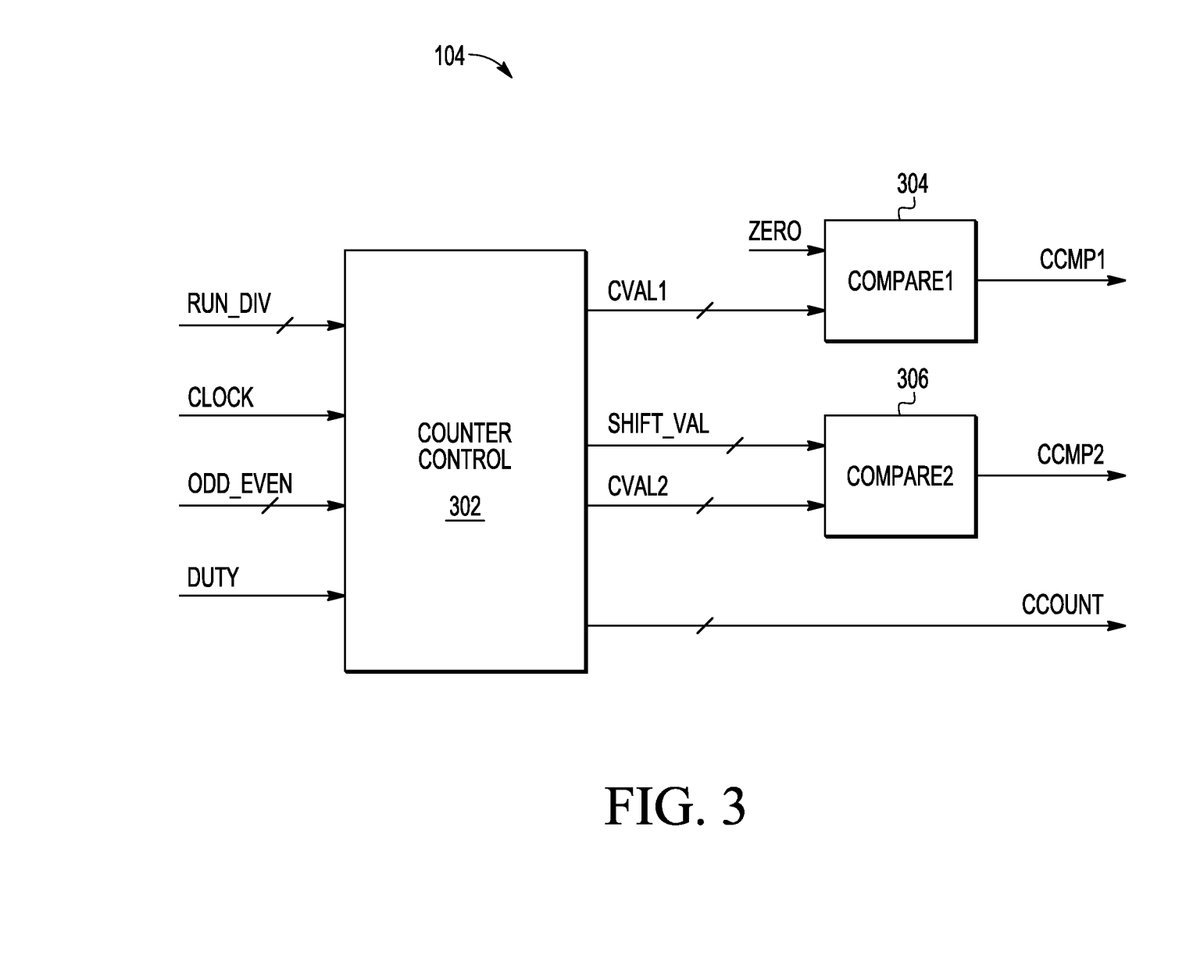
FIG. 3 illustrates, in simplified block diagram form, an example counter and control block 104 of FIG. 1 in accordance with an embodiment.

FIG. 3 illustrates, in simplified block diagram form, an example counter compare circuit block 104 of divider 100 accordance with an embodiment. The counter compare block 104 includes counter control (COUNTER CONTROL) portion 302 and compare portions (COMPARE1, COMPARE2) 304-306. The counter control portion 302 is configured to receive the RUN_DIV, CLOCK, ODD_EVEN, and DUTY signals and in turn generates a first counter value (CVAL1), a second counter value (CVAL2), a shift value (SHIFT_VAL), and current counter count (CCOUNT) signals. In this embodiment, the CVAL1, CVAL2, and the CCOUNT signals all provide the same current counter values.

The counter control portion 302 includes a counter and control circuitry. The counter is configured to count up and wrap to zero when an end count value is reached. In this embodiment, the end count value is generated by logically subtracting 1 from a current RUN_DIV signal value. The counter count values are provided to compare portions 304-306 by way of CVAL1 and CVAL2 signals and to the LCP block 102 by way of the CCOUNT signal. The SHIFT_VAL signal provides an intermediate count value which is generated by a logic shift right of the ODD_EVEN signal value then subtracting 1 or 2 depending upon whether the RUN_DIV signal value is odd or even. When the RUN_DIV signal LSB value is odd, the SHIFT_VAL signal value is generated by a logic shift right of the ODD_EVEN signal value then subtracting 2. When the RUN_DIV signal LSB value is even, the SHIFT_VAL signal value is generated by a logic shift right of the ODD_EVEN signal value then subtracting 1.

In a RUN_DIV odd example, if the RUN_DIV signal has a value of 13 (e.g., a binary value of 1101 with an LSB=1, odd), then the corresponding ODD_EVEN signal has a value of 14 (e.g., binary 1101+1=1110) and the SHIFT_VAL signal value is generated by performing a logical right shift by 1 operation on the ODD_EVEN signal value (e.g., binary 1110>>1=111 or decimal 7) then subtracting 2 from the shifted value (e.g., binary 111-10=101 or decimal 5). In a RUN_DIV even example, if the RUN_DIV signal has a value of 20 (e.g., a binary value of 10100 with an LSB=0, even), then the corresponding ODD_EVEN signal has a value of 20 and the SHIFT_VAL signal value is generated by performing a logical right shift by 1 operation on the ODD_EVEN signal value (e.g., binary 10100>>1=1010 or decimal 10) then subtracting 1 from the shifted value (e.g., binary 1010-1=1001 or decimal 9).

The compare portion 304 receives the current counter count signal CVAL1 and is configured to compare the CVAL1 value with 0 (zero). When the CVAL1 value equals 0, a pulse is generated in the CCMP1 output signal of the counter compare block 104. In this embodiment, the compare portion 304 is configured to generate the CCMP1 output signal pulse having a pulse width substantially equal to the period of the CLOCK signal.

The compare portion 306 receives the current counter count signal CVAL2 and the SHIFT_VAL signal and is configured to compare the CVAL2 value with the SHIFT_VAL value. When the CVAL2 value equals the SHIFT_VAL value, a pulse is generated in the CCMP2 output signal of the counter compare block 104. In this embodiment, the compare portion 306 is configured to generate the CCMP2 output signal pulse having a pulse width substantially equal to the period of the CLOCK signal.

Figure 4:
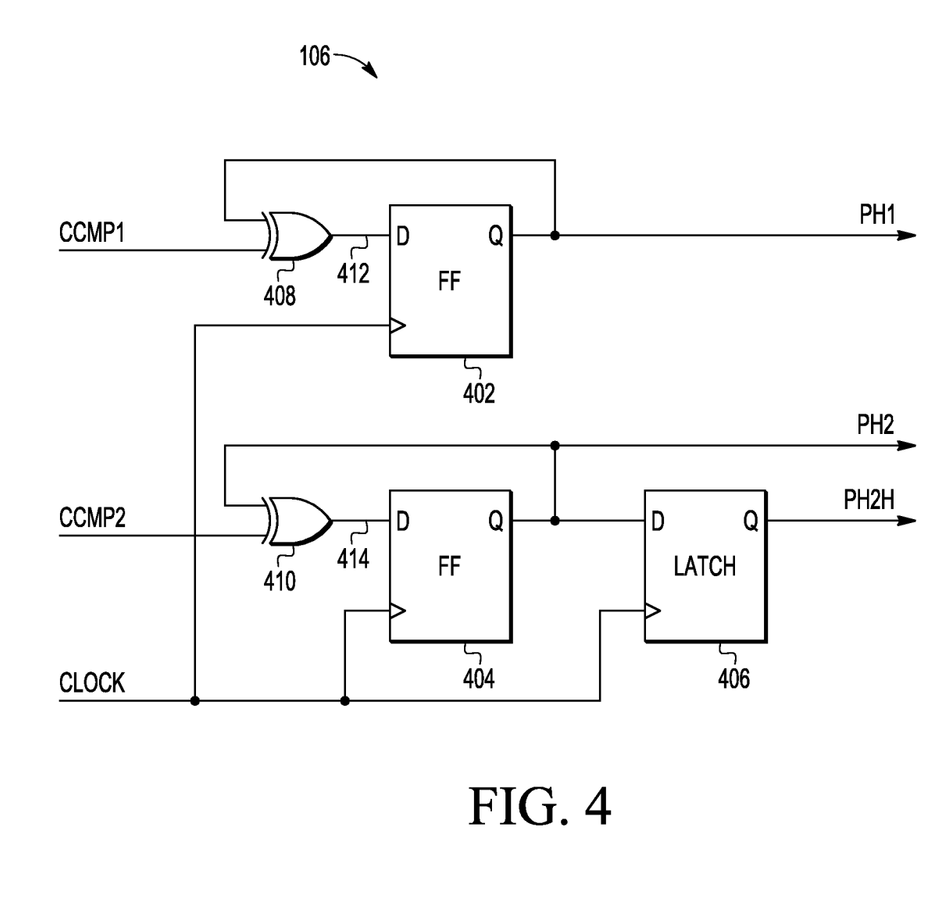
FIG. 4 illustrates, in simplified schematic diagram form, an example phase generation block 106 of FIG. 1 in accordance with an embodiment.

FIG. 4 illustrates, in simplified schematic diagram form, an example phase generation circuit block 106 of divider 100 in accordance with an embodiment. The phase generation block 106 includes inputs for receiving the CCMP1 and CCMP2 signals from the counter compare block 104 along with the CLOCK signal, and in turn, generates phase signals PH1, PH2, and PH2H. In this embodiment, the phase generation block 106 includes flip-flops 402-404, latch 406, and XOR gates 408-410.

Flip-flop 402 and XOR gate 408 are configured to form a first toggle flip-flop having a toggle input (e.g., first input of the XOR gate 408) coupled to receive the CCMP1 signal and an output (e.g., Q output) to provide the PH1 signal. A second input of the XOR gate 408 is coupled to a Q output of flip-flop 402 and an output of the XOR gate 408 is coupled to the D input of flip-flop 402. A clock input of flip-flop 402 is coupled to receive the CLOCK signal.

Flip-flop 404 and XOR gate 410 are configured to form a second toggle flip-flop having a toggle input (e.g., first input of the XOR gate 410) coupled to receive the CCMP2 signal and an output (e.g., Q output) to provide the PH2 signal. In this embodiment, the PH2 signal is 90 degrees out of phase with the PH1 signal. A second input of the XOR gate 410 is coupled to a Q output of flip-flop 404 and an output of the XOR gate 410 is coupled to the D input of flip-flop 404. A clock input of flip-flop 404 is coupled to receive the CLOCK signal. Latch 406 is coupled to receive the PH2 signal at a D input and provide the PH2H signal at a Q output. The latch 406 is configured to generate the PH2H signal as a half-cycle delayed version of the PH2 signal.

Figure 5:
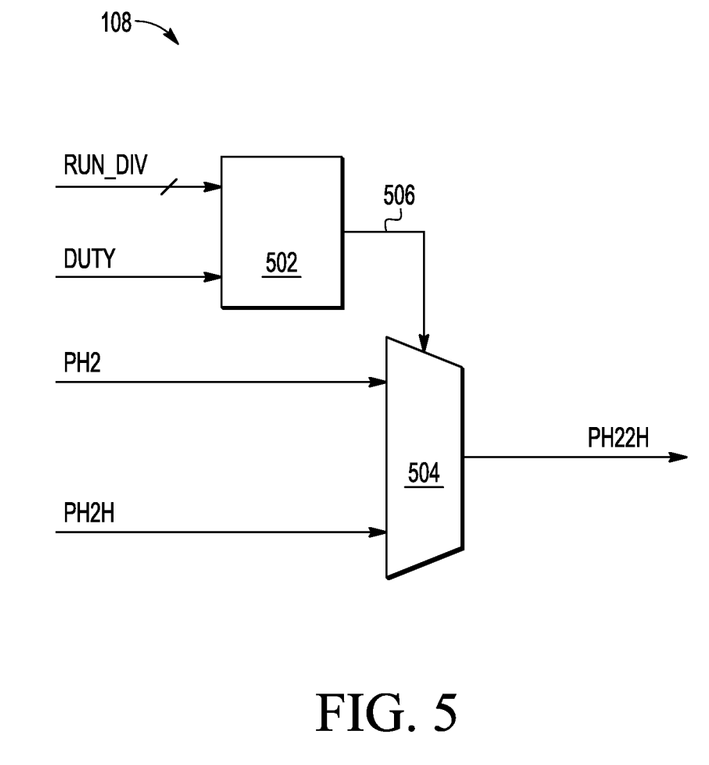
FIG. 5 illustrates, in simplified schematic diagram form, an example phase selection block 108 of FIG. 1 in accordance with an embodiment.

FIG. 5 illustrates, in simplified schematic diagram form, an example phase selection block 108 of divider 100 in accordance with an embodiment. The phase selection block 108 includes inputs for receiving the RUN_DIV, DUTY, PH2, and PH2H signals and an output for providing a selected one of PH2 and PH2H as an output signal PH22H. In this embodiment, the phase selection block 108 includes a control portion 502 and a multiplexer portion 504.

Control portion 502 is coupled to receive the RUN_DIV and DUTY signals and configured to generate the select signal 506 based on whether the RUN_DIV LSB value is odd or even and the DUTY signal value. For example, when the RUN_DIV LSB value is odd and the DUTY signal is at a logic high (e.g., 50% duty cycle), the select signal 506 is at a first logic state and when the RUN_DIV LSB value is even and the DUTY signal is at a logic high, the select signal 506 is at a second logic state.

Multiplexer portion 504 is coupled to receive the PH2 and PH2H phase signals and configured to provide a selected one of PH2 and PH2H at output PH22H based on the logic state of the received select signal 506. For example, when the control signal 506 is at the first logic state, the PH2H signal is coupled to the PH22H output, and when the control signal 506 is at the second logic state, the PH2 signal is coupled to the PH22H output.

Figure 6:
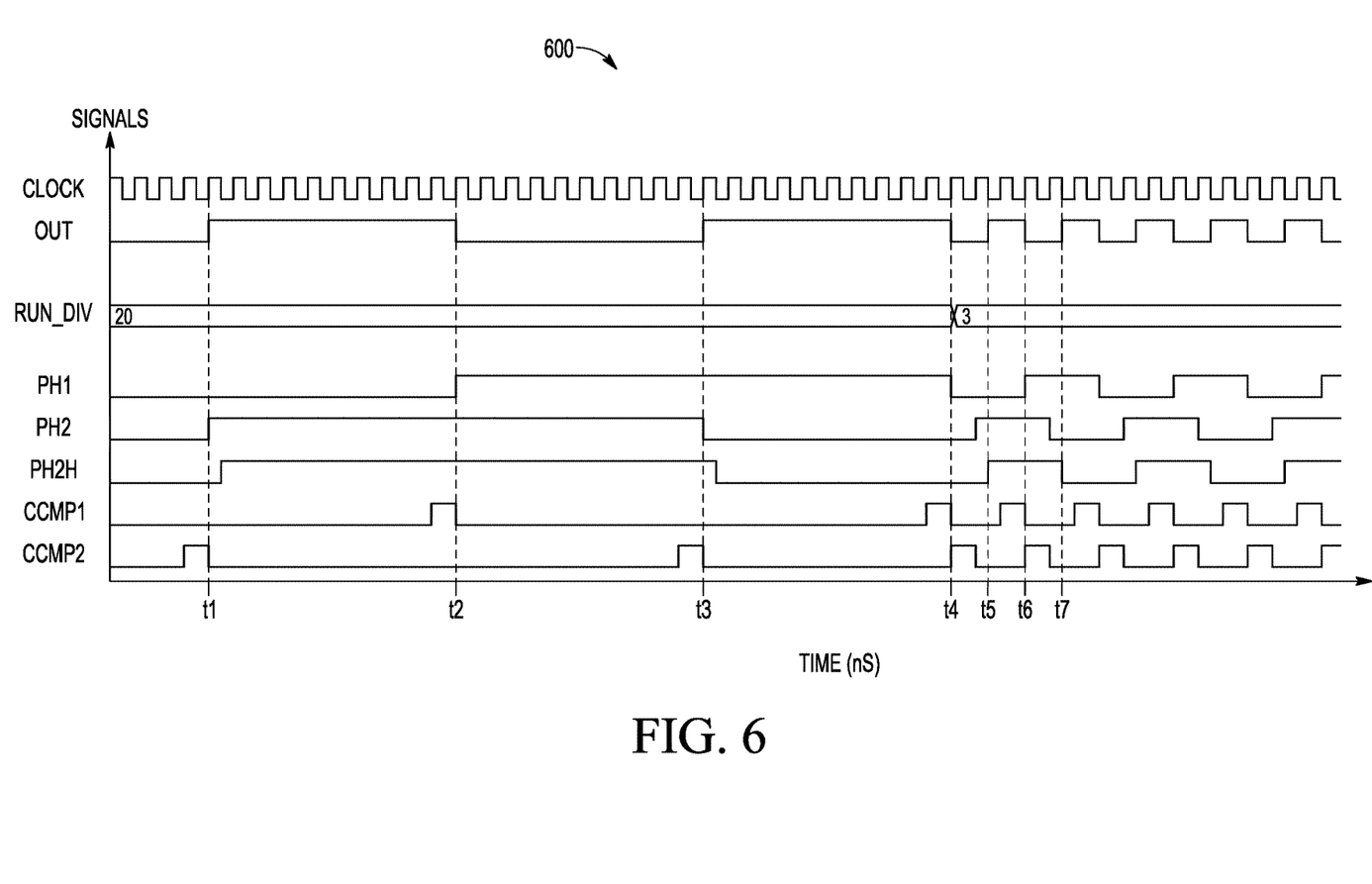
FIG. 6 illustrates, in plot diagram form, an example 50% duty clock simulation result and control signal timing of the programmable divider of FIG. 1 in accordance with an embodiment.

FIG. 6 illustrates, in plot diagram form, an example 50% duty (e.g., DUTY signal at a logic high) clock simulation result and control signal timing of divider 100 in accordance with an embodiment. Depicted in plot diagram 600 is control signal timing versus time during normal operation of divider 100 for a divide-by 20 followed by a divide-by 3 example. Plot diagram 600 includes waveforms for signals CLOCK, OUT, RUN_DIV, PH1, PH2, PH2H, CCMP1, and CCMP2 along the Y-axis and TIME in nanoseconds (nS) along the X-axis. In this embodiment, with the DUTY signal at a logic high, multiplexer 112 is configured to couple XOR 110 output signal 114 to output OUT to generate the OUT signal.

At time t1, the RUN_DIV signal has a value of 20 indicating a desired divide-by 20 of the source clock CLOCK. The PH2 signal transitions to a logic high as a result of the negative edge of CCMP2 signal pulse and the OUT signal transitions to a logic high as result of the PH2 logic high transition. In this embodiment, the pulse width of the CCMP2 signal pulse is substantially equal to one period of the CLOCK signal.

At time t2, the PH1 signal transitions to a logic high as a result of the negative edge of CCMP1 signal pulse. The OUT signal transitions to a logic low as a result of the PH1 logic high transition. The OUT signal transition to the logic low occurs 10 CLOCK cycles from the logic high transition at time t1, corresponding to the 50% duty cycle of the divide-by 20 signal. In this embodiment, the pulse width of the CCMP1 signal pulse is substantially equal to one period of the CLOCK signal.

At time t3, the PH2 signal transitions to a logic low as a result of the negative edge of CCMP2 signal pulse and the OUT signal transitions to a logic high as result of the PH2 logic low transition. The CLOCK signal divided by 20 and having a 50% duty cycle is illustrated with a full cycle of the OUT signal from time t1 to t3.

At time t4, the OUT signal completes a half cycle (e.g., 10 CLOCK cycles) from t3 and transitions to a logic low. Seamlessly, the RUN_DIV signal is updated to a value of 3 to indicate a desired divide-by 3 of the CLOCK signal. The PH1 signal transitions to a logic low as a result of the negative edge of CCMP1 signal pulse and the OUT signal transitions to a logic low as a result of the PH1 logic low transition.

At time t5, the PH2H signal transitions to a logic high as a result of the negative edge of CCMP2 signal pulse. The OUT signal transitions to a logic high as a result of the PH2H logic high transition. The OUT signal transition to the logic high occurs 1.5 CLOCK cycles from the logic low transition at time t4, corresponding to the 50% duty cycle of the divide-by 3 signal.

At time t6, the PH1 signal transitions to a logic high as a result of the negative edge of CCMP1 signal pulse and the OUT signal transitions to a logic low as result of the PH1 logic high transition. The CLOCK signal divided by 3 and having a 50% duty cycle is illustrated with a full cycle of the OUT signal from time t4 to t6.

At time t7, the OUT signal completes a half cycle (e.g., 1.5 CLOCK cycles) from t6 and transitions to a logic high. The PH2H signal transitions to a logic low as a result of the negative edge of CCMP2 signal pulse and the OUT signal transitions to the logic high as a result of the PH2H logic low transition.

Figure 7:
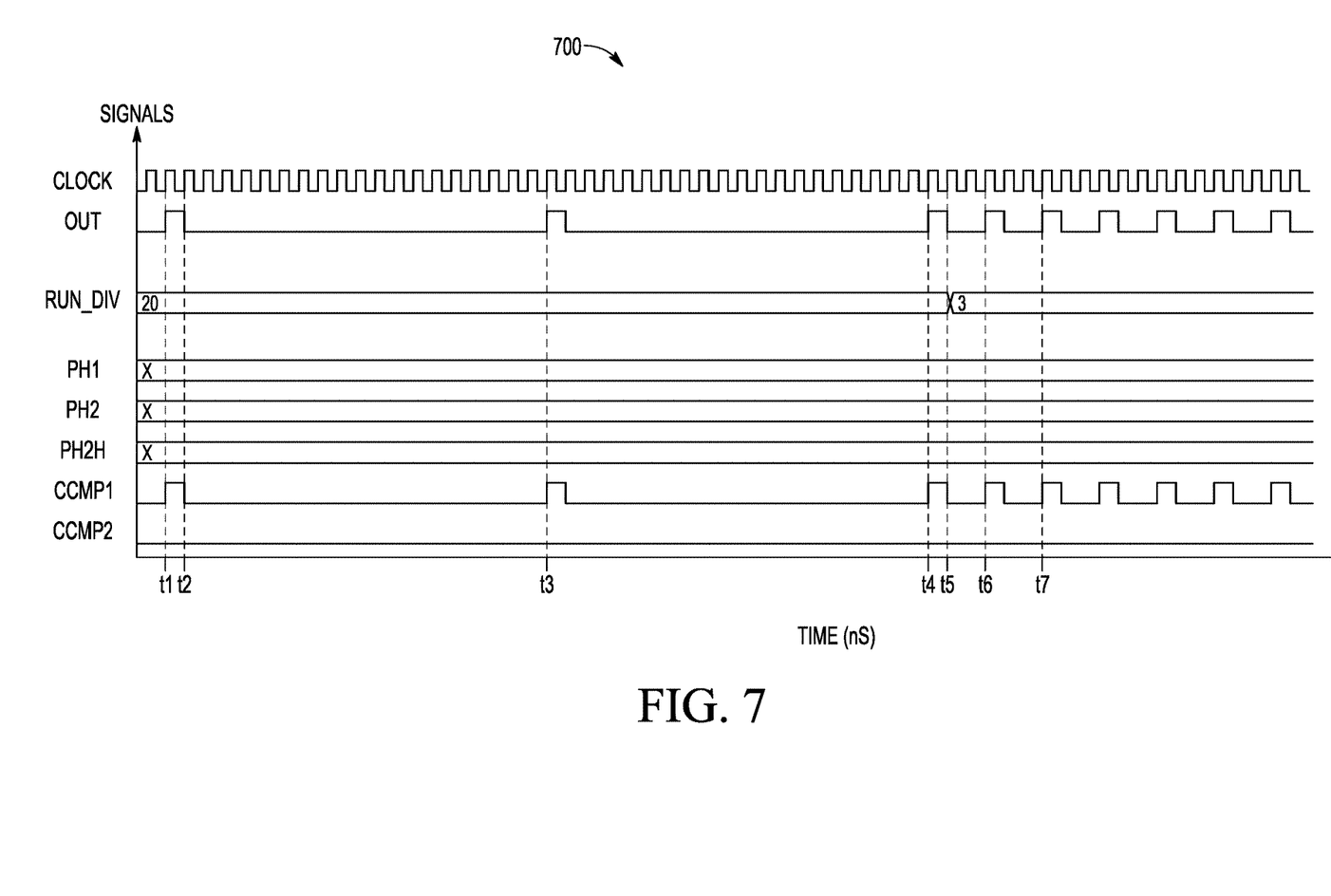
FIG. 7 illustrates, in plot diagram form, an example punch-out clock simulation result and control signal timing of the programmable divider of FIG. 1 in accordance with an embodiment.

FIG. 7 illustrates, in plot diagram form, an example punch-out (e.g., DUTY signal at a logic low) clock simulation result and control signal timing of divider 100 in accordance with an embodiment. Depicted in plot diagram 700 is control signal timing versus time during normal operation of divider 100 for a divide-by 20 followed by a divide-by 3 example. Plot diagram 700 includes waveforms for signals CLOCK, OUT, RUN_DIV, PH1, PH2, PH2H, CCMP1, and CCMP2 along the Y-axis and TIME in nanoseconds (nS) along the X-axis. In this embodiment, with the DUTY signal at a logic low, multiplexer 112 is configured to couple the CCMP1 signal to output OUT to generate the OUT signal. The PH1, PH2, and PH2H signals are shown having a value X and the CCMP2 signal is shown as a logic low to simplify simulation results as these signals do not contribute to the generation of the OUT signal in the embodiment depicted in FIG. 7.

At time t1, the RUN_DIV signal has a value of 20 indicating a desired divide-by 20 of the source clock CLOCK. The OUT signal transitions to a logic high as result of the positive edge of a pulse on the CCMP1 signal. At time t2, the OUT signal transitions to a logic low as result of the negative edge of the pulse on the CCMP1 signal. In this embodiment, the pulse width of the CCMP1 signal pulse is substantially equal to one period of the CLOCK signal and thus, the resulting pulse formed on the OUT signal has a similar pulse width.

At time t3, a second pulse is formed on the OUT signal as result of a second pulse on the CCMP1 signal. The OUT signal completes a first punch-out clock cycle (e.g., 20

CLOCK cycles) from t1 to t3 of the CLOCK signal divided by 20. In this configuration, the OUT punch-out cycle waveform is formed as a one-cycle logic high pulse and 19 cycles of logic low.

At time t4, a third pulse is formed on the OUT signal as result of a third pulse on the CCMP1 signal. The OUT signal completes a second punch-out clock cycle (e.g., 20 CLOCK cycles) from t1 to t3 of the CLOCK signal divided by 20.

At time t5, the OUT signal transitions to a logic low at the end of the pulse formed from t4 to t5. Seamlessly, the RUN_DIV signal is updated to a value of 3 to indicate a desired divide-by 3 of the CLOCK signal.

At time t6, a fourth pulse is formed on the OUT signal as result of a fourth pulse on the CCMP1 signal. The OUT signal completes a first punch-out clock cycle (e.g., 3 CLOCK cycles) from t4 to t6 of the CLOCK signal divided by 3. In this configuration, the OUT punch-out cycle waveform is formed as a one-cycle logic high pulse and 2 cycles of logic low.

At time t7, a fifth pulse is formed on the OUT signal as result of a fifth pulse on the CCMP1 signal. The OUT signal completes a second punch-out clock cycle (e.g., 3 CLOCK cycles) from t6 to t7 of the CLOCK signal divided by 3.

Generally, there is provided, a programmable divider circuit including a clock input coupled to receive a clock signal; a control input coupled to receive a first control signal; a counter compare circuit configured to receive a first load value, update a counter with the first load value, provide at a first output a first output signal, and when the first control signal is at a first value, generate a first pulse in the first output signal when the counter reaches an end value; and a load circuit configured to receive a first divider value and provide the first load value based on a current counter value of the counter. The first pulse in the first output signal may have a pulse width substantially equal to a clock period of the clock signal. The end value may be equal to the first load value minus one, and wherein the counter may be further configured to count up and wrap to zero when the first load value minus one is reached. The load circuit may be further configured to provide the first load value based on a bit-wise OR of the current counter value and the first divider value. The first control signal may be further configured to indicate a division type, the division type being any one of punch-out duty and 50% duty based on a corresponding value of the first control signal. The counter compare circuit may be further configured to provide at a second output a second output signal, and when the first control signal is at a second value, generate a second pulse in the second output signal when the counter reaches the end value and generate a third pulse in the first output signal when the counter reaches an intermediate value based on the second value. An output waveform of the programmable divider circuit may have a first edge based on the second pulse and a second edge based on the third pulse. The circuit may further include a multiplexer circuit configured to provide the output waveform based on the first output signal of the counter compare circuit or the second output signal of the counter compare circuit. The load circuit may be further configured to provide a second control signal based on the least significant bit (LSB) of the first divider value.

In another embodiment, there is provided, a programmable divider circuit including a clock input coupled to receive a clock signal; a first control input coupled to receive a first control signal, the first control signal configured to determine a division type; a counter compare circuit configured to receive a first load value, update a first counter with the first load value, provide at a first output a first output signal, and when the first control signal is at a first value corresponding to the division type characterized as punch-out duty, generate a first pulse in the first output signal when the first counter reaches an end value; and a load circuit configured to receive a first divider value and provide the first load value based on a current counter value of the first counter. The first pulse in the first output signal may have a pulse width substantially equal to a clock period of the clock signal. The end value may be equal to the first load value minus one, and wherein the first counter may be further configured to count up and wrap to zero when the first load value minus one is reached. The load circuit may be further configured to provide the first load value based on a bit-wise OR of the current counter value and the first divider value. The counter compare circuit may be further configured to provide at a second output a second output signal, and when the first control signal is at a second value corresponding to the division type characterized as 50% duty, generate a second pulse in the second output signal when the first counter reaches the end value and generate a third pulse in the first output signal when the counter reaches an intermediate value. An output waveform of the programmable divider circuit may have a first edge based on the second pulse and a second edge based on the third pulse. The circuit may further include a multiplexer circuit configured to provide the output waveform based on the first output signal of the counter compare circuit or the second output signal of the counter compare circuit. The load circuit may be further configured to provide a second control signal based on the least significant bit (LSB) of the first divider value.

In yet another embodiment, there is provided, a method for generating a divided clock signal including receiving a clock signal; updating a counter with a load value based on a current count value of the counter; generating a first pulse in a first output signal when the counter reaches an end value, the first pulse having a pulse width substantially equal to a period of the clock signal; and generating the divided clock signal based on the first output signal when the control signal is at a first value. The end value may be equal to the load value minus one, and wherein the counter may be further configured to count up and wrap to zero when the load value minus one is reached. The method may further include when the control signal is at a second value generating a second pulse in a second output signal when the counter reaches the end value; generating a third pulse in the first output signal when the counter reaches an intermediate value; and generating the divided clock signal having a first edge based on the second pulse and a second edge based on the third pulse.

By now it should be appreciated that there has been provided, a clock divider for generating a divided clock signal having programmable duty cycle type and divide-by values. The clock divider configuration allows for duty cycle and divide-by values to be updated on-the-fly, and switched to the updated duty cycle and/or divide-by values seamlessly and without causing glitches in the divided clock signal. The clock divider utilizes phase generation and selection circuitry configured to provide a more compact implementation and reduced power consumption.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A programmable divider circuit comprising:
   a clock input coupled to receive a clock signal;
   a control input coupled to receive a first control signal;
   a counter compare circuit configured to:
      receive a first load value,
      update a counter with the first load value,
      provide at a first output a first output signal, and
      when the first control signal is at a first value, generate a first pulse in the first output signal when the counter reaches an end value; and
   a load circuit configured to receive a first divider value and provide the first load value based on bit-wise OR of a current counter value of the counter and the first divider value.

2. The circuit of claim 1, wherein the first pulse in the first output signal has a pulse width substantially equal to a clock period of the clock signal.

3. The circuit of claim 1, wherein the end value is equal to the first load value minus one, and wherein the counter is further configured to count up and wrap to zero when the first load value minus one is reached.

4. The circuit of claim 1, wherein the first control signal is further configured to indicate a division type, the division type being any one of punch-out duty and 50% duty based on a corresponding value of the first control signal.

5. The circuit of claim 1, wherein the counter compare circuit is further configured to:
   provide at a second output a second output signal, and
   when the first control signal is at a second value, generate a second pulse in the second output signal when the counter reaches the end value and generate a third pulse in the first output signal when the counter reaches an intermediate value based on the second value.

6. The circuit of claim 5, wherein an output waveform of the programmable divider circuit has a first edge based on the second pulse and a second edge based on the third pulse.

7. The circuit of claim 6, further comprising a multiplexer circuit configured to provide the output waveform based on the first output signal of the counter compare circuit or the second output signal of the counter compare circuit.

8. The circuit of claim 1, wherein the load circuit is further configured to provide a second control signal based on the least significant bit (LSB) of the first divider value.

9. A programmable divider circuit comprising:
   a clock input coupled to receive a clock signal;
   a first control input coupled to receive a first control signal, the first control signal configured to determine a division type;
   a counter compare circuit configured to:
      receive a first load value,
      update a first counter with the first load value,
      provide at a first output a first output signal, and
      when the first control signal is at a first value corresponding to the division type characterized as punch-out duty, generate a first pulse in the first output signal when the first counter reaches an end value; and
   a load circuit configured to receive a first divider value and provide the first load value based on a bit-wise OR of a current counter value of the first counter and the first divider value.

10. The circuit of claim 9, wherein the first pulse in the first output signal has a pulse width substantially equal to a clock period of the clock signal.

11. The circuit of claim 9, wherein the end value is equal to the first load value minus one, and wherein the first counter is further configured to count up and wrap to zero when the first load value minus one is reached.

12. The circuit of claim 9, wherein the counter compare circuit is further configured to:
   provide at a second output a second output signal, and
   when the first control signal is at a second value corresponding to the division type characterized as 50% duty, generate a second pulse in the second output signal when the first counter reaches the end value and generate a third pulse in the first output signal when the counter reaches an intermediate value.

13. The circuit of claim 12, wherein an output waveform of the programmable divider circuit has a first edge based on the second pulse and a second edge based on the third pulse.

14. The circuit of claim 13, further comprising a multiplexer circuit configured to provide the output waveform based on the first output signal of the counter compare circuit or the second output signal of the counter compare circuit.

15. The circuit of claim 9, wherein the load circuit is further configured to provide a second control signal based on the least significant bit (LSB) of the first divider value.

16. A method for generating a divided clock signal, the method comprising:
   receiving a clock signal;
   updating a counter with a load value based on a current count value of the counter;
   generating a first pulse in a first output signal when the counter reaches an end value, the first pulse having a pulse width substantially equal to a period of the clock signal;
   generating the divided clock signal based on the first output signal when the control signal is at a first value;
   generating a second pulse in a second output signal when the counter reaches the end value;
   generating a third pulse in the first output signal when the counter reaches an intermediate value; and generating the divided clock signal having a first edge based on the second pulse and a second edge based on the third pulse.

17. The method of claim 16, wherein the end value is equal to the load value minus one, and wherein the counter is further configured to count up and wrap to zero when the load value minus one is reached.

18. A programmable divider circuit comprising:
a clock input coupled to receive a clock signal;
a control input coupled to receive a first control signal;
a counter compare circuit configured to:
  receive a first load value,
  update a counter with the first load value,
  provide at a first output a first output signal,
  provide at a second output a second output signal,
  when the first control signal is at a first value, generate a first pulse in the first output signal when the counter reaches an end value, and
  when the first control signal is at a second value, generate a second pulse in the second output signal when the counter reaches the end value and generate a third pulse in the first output signal when the counter reaches an intermediate value based on the second value; and
a load circuit configured to receive a first divider value and provide the first load value based on a current counter value of the counter.

19. A programmable divider circuit comprising:
a clock input coupled to receive a clock signal;
a control input coupled to receive a first control signal;
a counter compare circuit configured to:
  receive a first load value,
  update a counter with the first load value,
  provide at a first output a first output signal, and
  when the first control signal is at a first value, generate a first pulse in the first output signal when the counter reaches an end value; and
a load circuit configured to receive a first divider value, provide the first load value based on a current counter value of the counter, and provide a second control signal based on the least significant bit (LSB) of the first divider value.

20. A programmable divider circuit comprising:
a clock input coupled to receive a clock signal;
a first control input coupled to receive a first control signal, the first control signal configured to determine a division type;
a counter compare circuit configured to:
  receive a first load value,
  update a first counter with the first load value,
  provide at a first output a first output signal, and
  when the first control signal is at a first value corresponding to the division type characterized as punch-out duty, generate a first pulse in the first output signal when the first counter reaches an end value; and
a load circuit configured to receive a first divider value, provide the first load value based on a current counter value of the first counter, and provide a second control signal based on the least significant bit (LSB) of the first divider value.

* * * * *